United States Patent
Yang

(10) Patent No.: US 9,520,184 B2
(45) Date of Patent: Dec. 13, 2016

(54) METHOD FOR WRITING IN-SYSTEM PROGRAMMING CODE INTO FLASH MEMORY FOR BETTER NOISE MARGIN

(71) Applicant: Silicon Motion Inc., Hsinchu County (TW)

(72) Inventor: Tsung-Chieh Yang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 0 days.

(21) Appl. No.: 14/615,435

(22) Filed: Feb. 6, 2015

(65) Prior Publication Data

US 2015/0228332 A1 Aug. 13, 2015

(30) Foreign Application Priority Data

Feb. 10, 2014 (TW) .................................. 103104287

(51) Int. Cl.
| | | |
|---|---|---|
| *G11C 11/56* | (2006.01) | |
| *G11C 7/02* | (2006.01) | |
| *G11C 16/04* | (2006.01) | |
| *G11C 16/10* | (2006.01) | |
| *G11C 7/10* | (2006.01) | |

(52) U.S. Cl.
CPC ............. *G11C 11/5628* (2013.01); *G11C 7/02* (2013.01); *G11C 16/0483* (2013.01); *G11C 16/10* (2013.01); *G11C 7/1006* (2013.01)

(58) Field of Classification Search
None
See application file for complete search history.

(56) References Cited

U.S. PATENT DOCUMENTS

| | | | |
|---|---|---|---|
| 7,545,673 B2 | 6/2009 | Lasser | |
| 9,152,551 B2 | 10/2015 | Mun | |
| 2011/0016263 A1* | 1/2011 | Lin | G11C 29/02 711/103 |
| 2011/0317480 A1* | 12/2011 | Lung | G11C 13/0004 365/163 |
| 2012/0033492 A1* | 2/2012 | Chen | G11C 11/5628 365/185.03 |
| 2014/0101372 A1* | 4/2014 | Jung | G06F 12/0253 711/103 |
| 2015/0023108 A1* | 1/2015 | Kang | G11C 16/26 365/185.21 |
| 2015/0179275 A1* | 6/2015 | Patel | G11C 16/10 365/185.17 |

FOREIGN PATENT DOCUMENTS

| | | |
|---|---|---|
| JP | 201320620 A | 1/2013 |
| KR | 1020100068364 A | 6/2010 |
| TW | 200921677 | 5/2009 |

* cited by examiner

*Primary Examiner* — Han Yang
*Assistant Examiner* — Sultana Begum
(74) *Attorney, Agent, or Firm* — Winston Hsu; Scott Margo

(57) ABSTRACT

The present invention provides a method for writing a data into a flash memory, wherein the flash memory is a Triple-Level Cell flash memory, and each storage unit of the flash memory is implemented by a floating-gate transistor and each storage unit supports eight write voltage levels, and the method includes: adjusting the data bit by bit to generate a pseudo-random bit sequence; and writing the pseudo-random bit sequence into the flash memory with only two specific voltage levels of the eight write voltage levels.

6 Claims, 6 Drawing Sheets

METHOD FOR WRITING IN-SYSTEM PROGRAMMING CODE INTO FLASH MEMORY FOR BETTER NOISE MARGIN

BACKGROUND OF THE INVENTION

1. Field of the Invention

The present invention is related to a flash memory, and more particularly, to a method for writing data into flash memory and associated memory device and flash memory.

2. Description of the Prior Art

Flash memory can be electrically erased and programmed for data storage. It is widely applied in memory cards, solid-state drives, portable multimedia players, etc. As the flash memory is a non-volatile memory, no power is needed to maintain the information stored in the flash memory. In addition, the flash memory provides fast read access and better shock resistance. These characteristics explain the popularity of the flash memory.

The flash memories may be categorized into NOR-type flash memories and NAND-type flash memories. Regarding the NAND flash memory, it has reduced erasing and programming time and requires less chip area per cell, thus allowing greater storage density and lower cost per bit than the NOR flash memory. In general, the flash memory stores data in an array of memory cells made from floating-gate transistors. Each memory cell can store one bit of information or more than one bit of information by adequately controlling the number of electrical charge on its floating gate to configure the threshold voltage required for turning on the memory cell made of a floating-gate transistor. In this way, when one or more predetermined control gate voltages are applied to a control gate of the floating-gate transistor, the conductive status of the floating-gate transistor would indicate the binary digit(s) stored by the floating-gate transistor.

An In-System Programming code, so called ISP code hereinafter, is generally stored in one page of a first block of the flash memory, and the ISP code is arranged to store some basic information such like the name of brand, the type of flash memory (for example Single-Level Cell (SLC), Multiple-Level Cell (MLC) or Triple-Level Cell (TLC)), etc. The flash memory controller reads the ISP code first to acquire the needed information then executes operations like reading or writing to the flash memory.

However, in the process of packaging of flash memory, especially for TLC flash memory, the ISP code stored in the flash memory may be changed because the threshold voltage distribution of memory cells of flash memory cells changed due to the temperature or other factors, therefore using original control gate voltage setting (i.e., threshold voltage setting) to read the stored bits from the memory cell may fail to obtain the correct stored information due to the changed threshold voltage distribution. In this way, the flash memory controller may not be able to read the ISP code correctly then causes the flash memory can't be used to perform following access operations.

SUMMARY OF THE INVENTION

One of the objectives of the present invention is to provide a method which the written data has better noise margin to solve the aforementioned problems.

The present invention provides a method for writing a data into a flash memory according to an embodiment of the present invention, wherein the flash memory is a TLC flash memory. Each storage unit of the flash memory is implemented by a floating-gate transistor and each storage unit supports eight write voltage levels, and the method comprises: adjusting the data bit by bit to generate a pseudo-random bit sequence; and utilizing only two specific voltage levels of the eight write voltage levels to write the pseudo-random bit sequence into the flash memory.

In an embodiment, the pseudo-random bit sequence is written into a least significant bit (LSB) page of a block of the flash memory, and at least one of the two specific voltage levels is not the closest one to at least one threshold voltage arranged to read the LSB page; in addition, in an embodiment, the eight write voltage levels sequentially are a first voltage level, a second voltage level, a third voltage level, a fourth voltage level, a fifth voltage level, a sixth voltage level, a seventh voltage level and an eighth voltage level, respectively. The most significant bit so called MSB herein after, the central significant bit so called CSB hereinafter and the LSB corresponding to the first voltage level are (1, 1, 1) respectively. The MSB, the CSB and the LSB corresponding to the second voltage level are (1, 1, 0). The MSB, the CSB and the LSB corresponding to the third voltage level are (1, 0, 0). The MSB, the CSB and the LSB corresponding to the fourth voltage level are (0, 0, 0). The MSB, the CSB and the LSB corresponding to the fifth voltage level are (0, 1, 0). The MSB, the CSB and the LSB corresponding to the sixth voltage level are (0, 1, 1). The MSB, the CSB and the LSB corresponding to the seventh voltage level are (0, 0, 1). The MSB, the CSB and the LSB corresponding to the eighth voltage level are (1, 0, 1), and the two specific voltage levels are the first voltage level and the fourth voltage level.

According to another embodiment of the present invention, a memory device comprises a flash memory and a controller, wherein the flash memory is a TLC flash memory. Each storage unit of the flash memory is implemented by a floating-gate transistor and each storage unit supports eight write voltage levels, and the flash memory stores one data; the controller is used to access the flash memory; in addition, before the first time the controller reads the flash memory, the data of the flash memory is stored into the flash memory with only two specific voltage levels of the eight write voltage levels.

According to another embodiment of the present invention, disclosing a flash memory, wherein the flash memory is a TLC flash memory, and each storage unit of the flash memory is implemented by a floating-gate transistor and supports eight write voltage levels, and the flash memory stores data; wherein before the first time the flash memory read by the controller, the data of the flash memory is stored in the flash memory with only two specific voltages of the eight write voltage levels.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
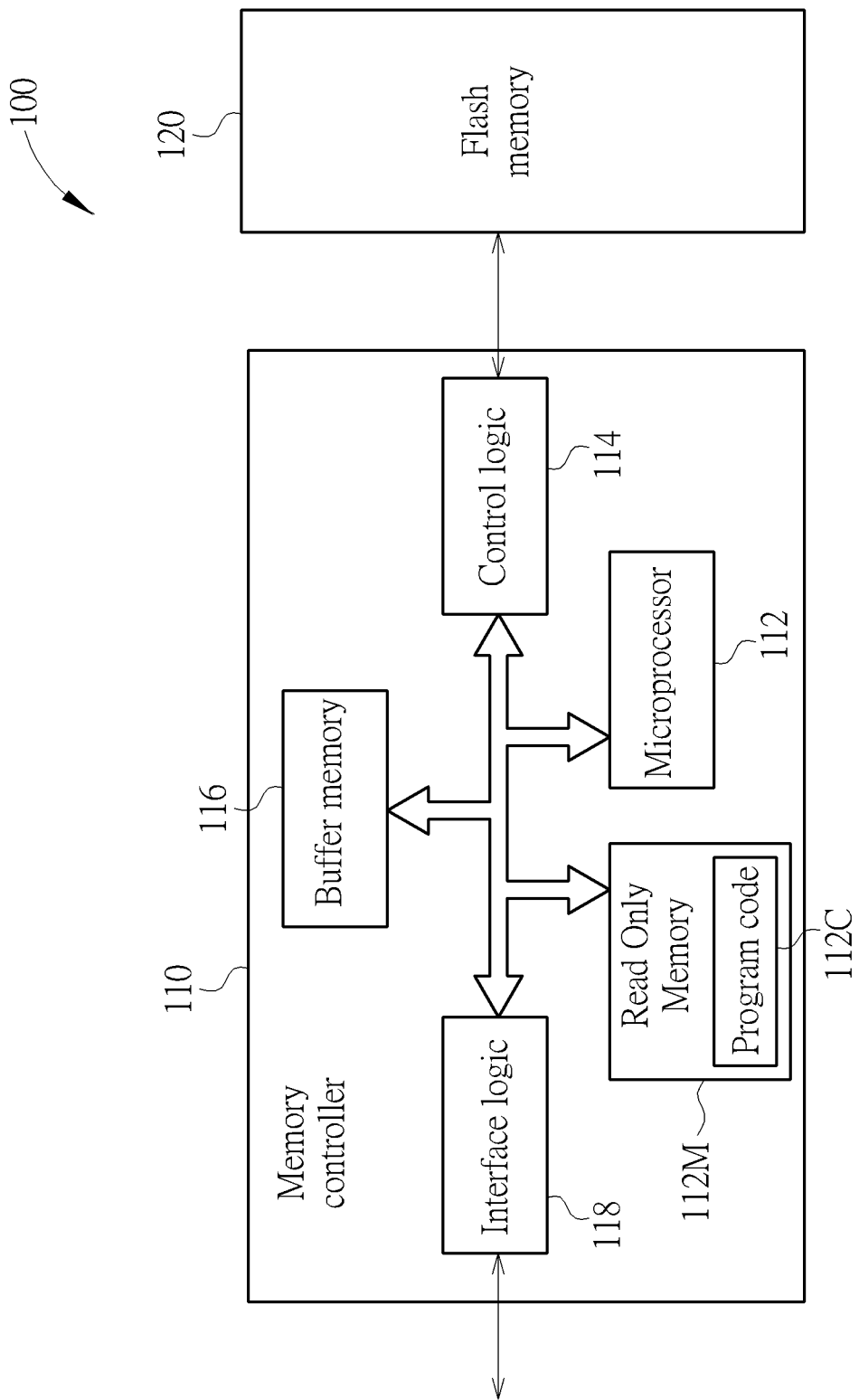
FIG. 1 is a diagram illustrating a memory device according to an embodiment of the present invention.

Refer to FIG. 1, which is a diagram illustrating a memory device 100 according to an embodiment of the present invention, wherein the memory device 100 of the present invention is particularly a portable memory device (for example a memory card complying with SD/MMC, CF, MS, or XD standard). The memory device 100 comprises a flash memory 120, and a controller which can be a memory controller 110 and arranged to access the flash memory 120. According to this embodiment, the memory controller 110 comprises a microprocessor 112, a read only memory (ROM) 112M, a control logic 114, a buffer memory 116 and an interface logic 118. The ROM 112M is arranged to store a program code 112C, and the microprocessor 112 is arranged to execute the program code 112C to control the access to the flash memory 120.

In typical situations, the flash memory 120 comprises a plurality of blocks, and the controller (e.g. the memory controller 110 executing the code 112C via the microprocessor 112) executes data copying, erasure and combining operations on the flash memory 120 by copying, erasing and combining in units of blocks. In addition, a block can record specific number of pages, wherein the controller (e.g. the memory controller 110 executing the code 112C via the microprocessor 112) executes data writing operation on the flash memory 120 by writing/programming in units of pages.

In practical, the memory controller 110 executing the code 112C via the microprocessor 112 can execute a lot of control operations by using internal elements. For example, the memory controller 110 utilizes the control logic 114 to control access to the flash memory 120 (particularly the access to at least one block or at least one page), utilizes the buffer memory 116 to perform the needed buffering process, and utilizes the interface logic 118 to communicate with a host device.

Figure 2:
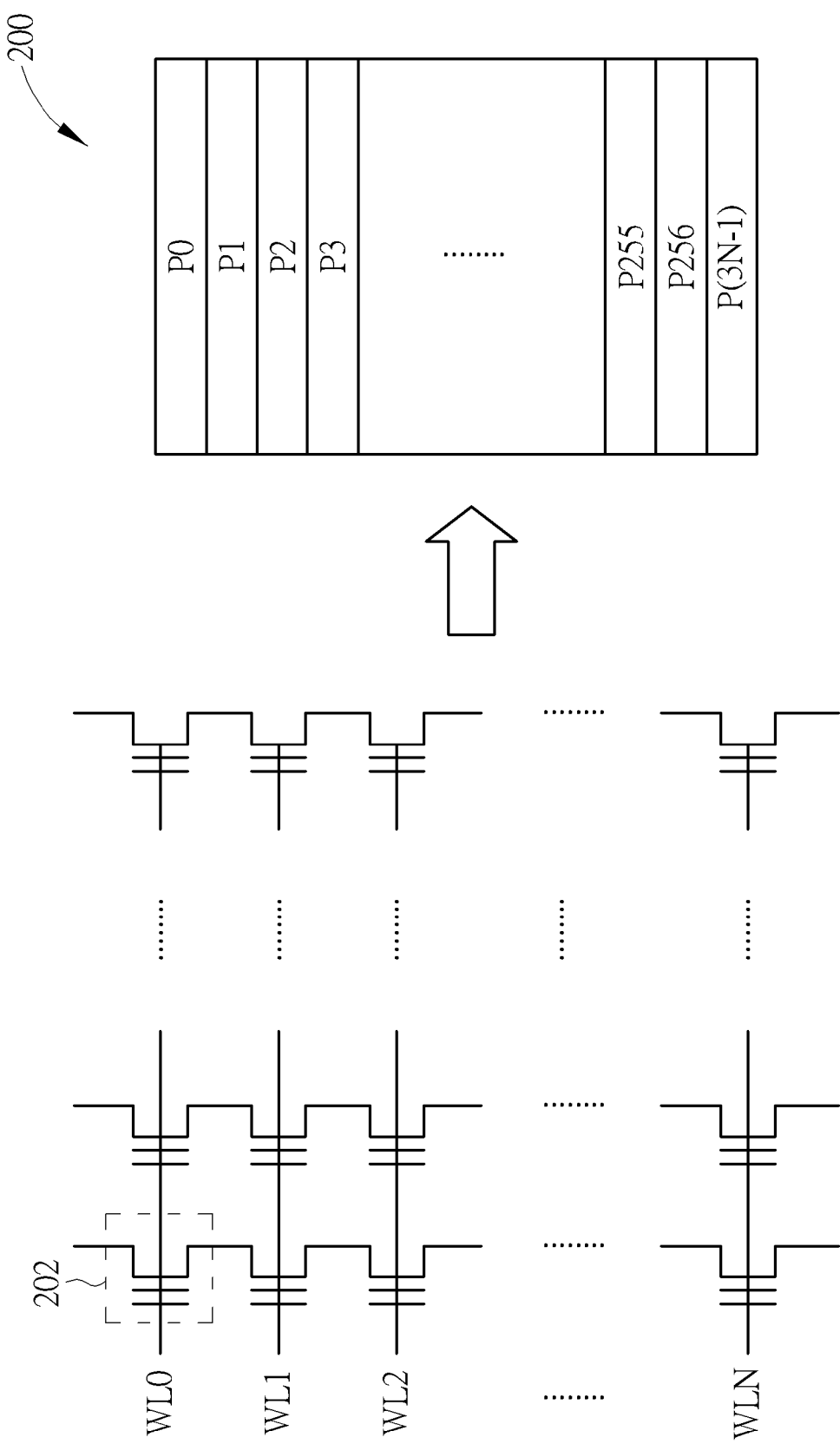
FIG. 2 is a diagram illustrating a block of flash memory according to an embodiment of the present invention.

Refer to FIG. 2, which is a diagram illustrating the block 200 of the flash memory 120 according to an embodiment of the present invention. As shown in FIG. 2, the block 200 is a TLC architecture, that is the block 200 has N word lines WL0 to WLN, and each word line constitutes three pages, so the block 200 comprises 3*N pages in total (P0 to P (3N−1)). Each storage unit in FIG. 2 (i.e. each floating-gate transistor 202) can store three bits, i.e. the three bits comprising the LSB, the CSB and the MSB. The LSBs stored in a plurality of storage units of each word line WL0 to WLN constitute a first page corresponding to the word line. The stored CSBs constitute a second page corresponding to the word line and the stored MSBs constitute a third page corresponding to the word line.

Figure 3:
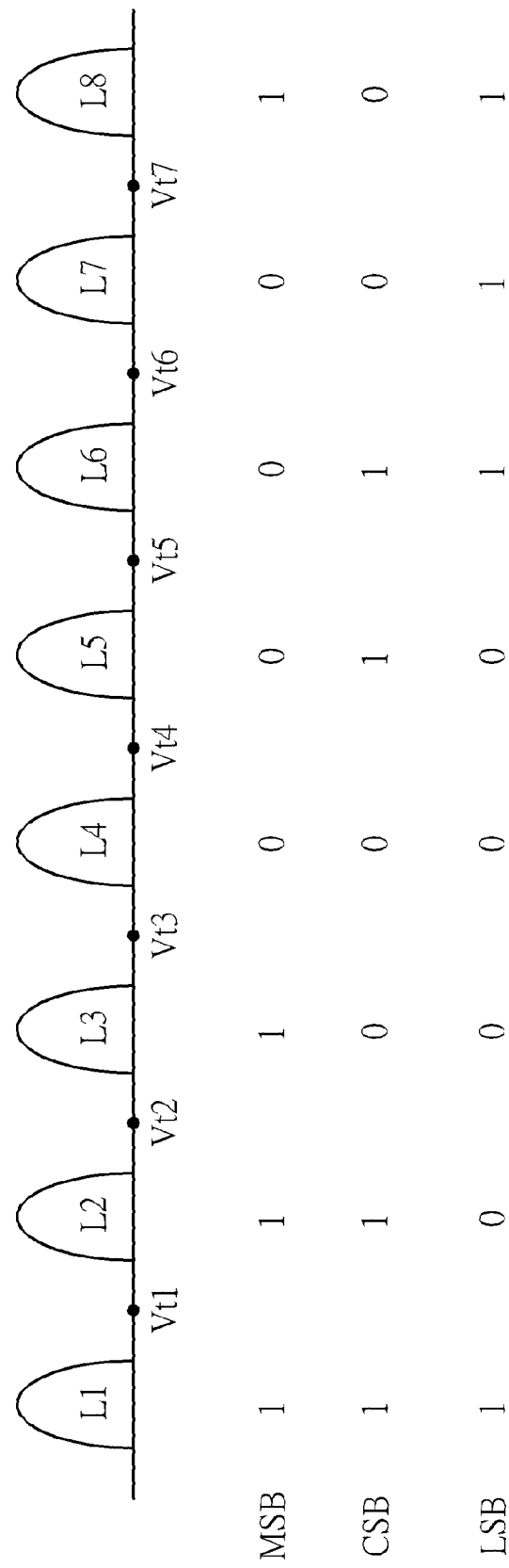
FIG. 3 is a diagram illustrating a plurality of write voltage levels and a plurality of threshold voltages of a page.

In detail, refer to FIG. 3, which is a diagram illustrating a plurality of write voltage levels L1 to L8 and a plurality of threshold voltages Vt1 to Vt7 of the pages (P0 to P (3N−1)). As shown in FIG. 3, each floating-gate transistor 202 can be programmed to have a voltage level L1 (i.e. (MSB, CSB, LSB)=(1, 1, 1)), a voltage level L2 (i.e. (MSB, CSB, LSB)=(1, 1, 0)), a voltage level L3 (i.e. (MSB, CSB, LSB)=(1, 0, 0)), a voltage level L4 (i.e. (MSB, CSB, LSB)=(0, 0, 0)), a voltage level L5 (i.e. (MSB, CSB, LSB)=(0, 1, 0)), a voltage level L6 (i.e. (MSB, CSB, LSB)=(0, 1, 1)), a voltage level L7 (i.e. (MSB, CSB, LSB)=(0, 0, 1)) or a voltage level L8 (i.e. (MSB, CSB, LSB)=(1, 0, 1)).

When the memory controller 110 needs to read the LSB of the floating-gate transistor 202, the memory controller 110 uses the threshold voltages Vt1 and Vt5 to read the floating-gate transistor 202, and decides the LSB is "1" or "0" according to the conductive status (whether there is a current or not) of the floating-gate transistor 202. In this embodiment, the floating-gate transistor 202 is turned on when the memory controller 110 applies the threshold voltage Vt5 on a gate terminal of the floating-gate transistor 202 and/or the floating-gate transistor 202 is turned off when the memory controller 110 applies the threshold voltage Vt1 on the gate terminal of the floating-gate transistor 202, means the LSB is "1"; and the floating-gate transistor 202 is turned off when the memory controller 110 applies the threshold voltage Vt5 on the gate terminal of the floating-gate transistor 202 and the floating-gate transistor 202 is turned on when the memory controller 110 applies the threshold voltage Vt1 on the gate terminal of the floating-gate transistor 202, means the LSB is "0".

When the memory controller 110 needs to read the CSB of the floating-gate transistor 202, the memory controller 110 uses the threshold voltages Vt2, Vt4 and Vt6 to read the floating-gate transistor 202, and decides the CSB is "1" or "0" according to the conductive status (whether there is a current or not) of the floating-gate transistor 202. In this embodiment, the floating-gate transistor 202 is turned off when the memory controller 110 applies the threshold voltage Vt2 on the gate terminal of the floating-gate transistor 202, means the CSB is "1"; the floating-gate transistor 202 is turned off when the memory controller 110 applies the threshold voltage Vt4 on the gate terminal of the floating-gate transistor 202, but the floating-gate transistor 202 is turned on when the memory controller 110 applies the threshold voltage Vt2 on the gate terminal of the floating-gate transistor 202, means the CSB is "1"; the floating-gate transistor 202 is turned off when the memory controller 110 applies the threshold voltage Vt6 on the gate terminal of the floating-gate transistor 202, but the floating-gate transistor 202 is turned on when the memory controller 110 applies the threshold voltage Vt4 on the gate terminal of the floating-gate transistor 202, means the CSB is also "1"; and the floating-gate transistor 202 is turned on when the memory controller 110 applies the threshold voltage Vt6 on the gate terminal of the floating-gate transistor 202, means the CSB is "0".

When the memory controller 110 needs to read the MSB of the floating-gate transistor 202, the memory controller 110 uses the threshold voltages Vt3 and Vt7 to read the floating-gate transistor, and decides the MSB is "1" or "0" according to the conductive status (whether there is a current or not) of the floating-gate transistor 202. In this embodiment, the floating-gate transistor 202 is turned on when the memory controller 110 applies the threshold voltage Vt7 on the gate terminal of the floating-gate transistor 202 and/or the floating-gate transistor 202 is turned off when the memory controller 110 applies the threshold voltage Vt3 on the gate terminal of the floating-gate transistor 202, means the MSB is "1"; and the floating-gate transistor 202 is turned off when the memory controller 110 applies the threshold voltage Vt7 on the gate terminal of the floating-gate transistor 202, but the floating-gate transistor 202 is turned on when the memory controller 110 applies the threshold voltage Vt3 on the gate terminal of the floating-gate transistor 202, means the MSB is "0".

Before the flash memory 120 is manufactured to be the memory device 100, the supplier of the flash memory writes the ISP code into the first page of the flash memory first, this ISP code is arranged to store some basic information, for example, the name of brand, the type of the flash memory (SLC, MLC or TLC), etc. For the first time the memory controller reads the flash memory 120, the memory controller 110 needs to read the ISP code first to acquire the needed information then the data read/write operations on the flash memory 120 are allowed to be performed.

Figure 4:
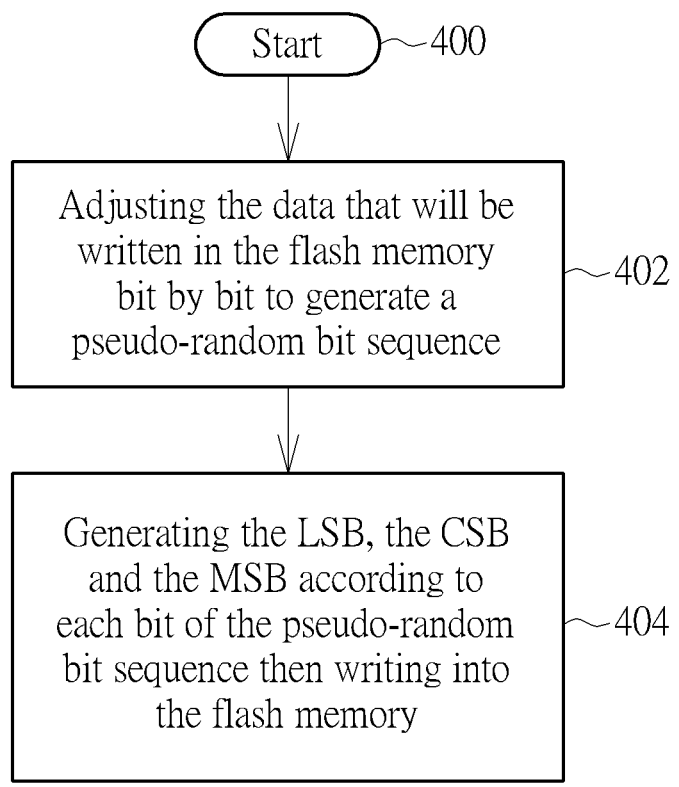
FIG. 4 is a flowchart illustrating a method for writing an ISP code into a flash memory according to an embodiment of the present invention.

Refer to FIG. 4, which is a flowchart illustrating the method for writing the ISP code into the flash memory 120. The flow in FIG. 4 can be executed in a wafer stage, i.e. being executed before the wafer is cut into flash memory die, or being executed in packaging stage. Refer to FIG. 4, the flow is described as follows:

In step 400: The flow starts. In step 402, a random data generator is used to adjust the data that will be written in the flash memory chip bit by bit (in this embodiment that data is ISP code, the following statement uses ISP code as example) to generate a pseudo-random bit sequence, wherein the random data generator can be implemented by hardware or software. In this embodiment, the pseudo-random bit sequence is going to be written into the LSB page of the first page of the first block of the flash memory chip 120 (e.g. the LSB page of the floating-gate transistor of the word line WL0 of FIG. 2).

Next, in step 404, the corresponding LSB, CSB and MSB are generated according to each bit of the pseudo-random bit sequence, and the generated LSBs, CSBs and MSBs are written into the word line WL0 of FIG. 2. In this embodiment, for each bit of the pseudo-random bit sequence, the bit serves as the corresponding LSB, CSB and MSB in the same time, then the LSB, the CSB and the MSB are written into the word line WL0 of FIG. 2. Specifically, refer to FIG. 5 and FIG. 6, the random data generator 510 receives the ISP code to generate a pseudo-random bit sequence, and each bit of this pseudo-random bit sequence will be the LSB, the CSB and the MSB in the same time. Because the LSB, the CSB and the MSB have the same value, therefore every floating-gate transistor of the word line WL0 will be programmed to have the voltage level L1 (i.e. (MSB, CSB, LSB)=(1, 1, 1)) or the voltage level L4 (i.e. (MSB, CSB, LSB)=(0, 0, 0)) instead of being programmed to have other voltage levels.

Explaining the flowchart in FIG. 4 in other words, the aforementioned flow in FIG. 4 can be regarded as storing the ISP code in the LSB page after the random data generator 510 generating the pseudo-random bit sequence by receiving the ISP code, and in order to write the pseudo-random bit sequence into the LSB page with the two specific voltages (i.e. the aforementioned L1 and L4), regarding each bit of the pseudo-random bit sequence, it further needs to generate the CSB and the MSB to correctly write data into the floating-gate transistor of the word line WL0 of the FIG. 2. More specifically, assume the pseudo-random bit sequence is "11001 . . . " then the random data generator 510 generates the data which the LSB, the CSB and the MSB are (1, 1, 1), and programs the first floating-gate transistor of the word line WL0 of FIG. 2 to have the voltage level L1; next, the random data generator 510 generates the data which the LSB, the CSB and the MSB are (1, 1, 1), and programs the second floating-gate transistor of the word line WL0 of FIG. 2 to have the voltage level L1; next, the random data generator 510 generates the data which the LSB, the CSB and the MSB are (0, 0, 0), and programs the third floating-gate transistor of the word line WL0 of FIG. 2 to have the voltage level L4; next, the random data generator 510 generates the data which the LSB, the CSB and the MSB are (0, 0, 0), and programs the fourth floating-gate transistor of the word line WL0 of FIG. 2 to have the voltage level L4; next, the random data generator 510 generates the data which the LSB, the CSB and the MSB are (1, 1, 1), and programs the fifth floating-gate transistor of the word line WL0 of FIG. 2 to have the voltage level L1 . . . and so on, until all the pseudo-random bit sequence are written into the flash memory 120.

Figure 6:
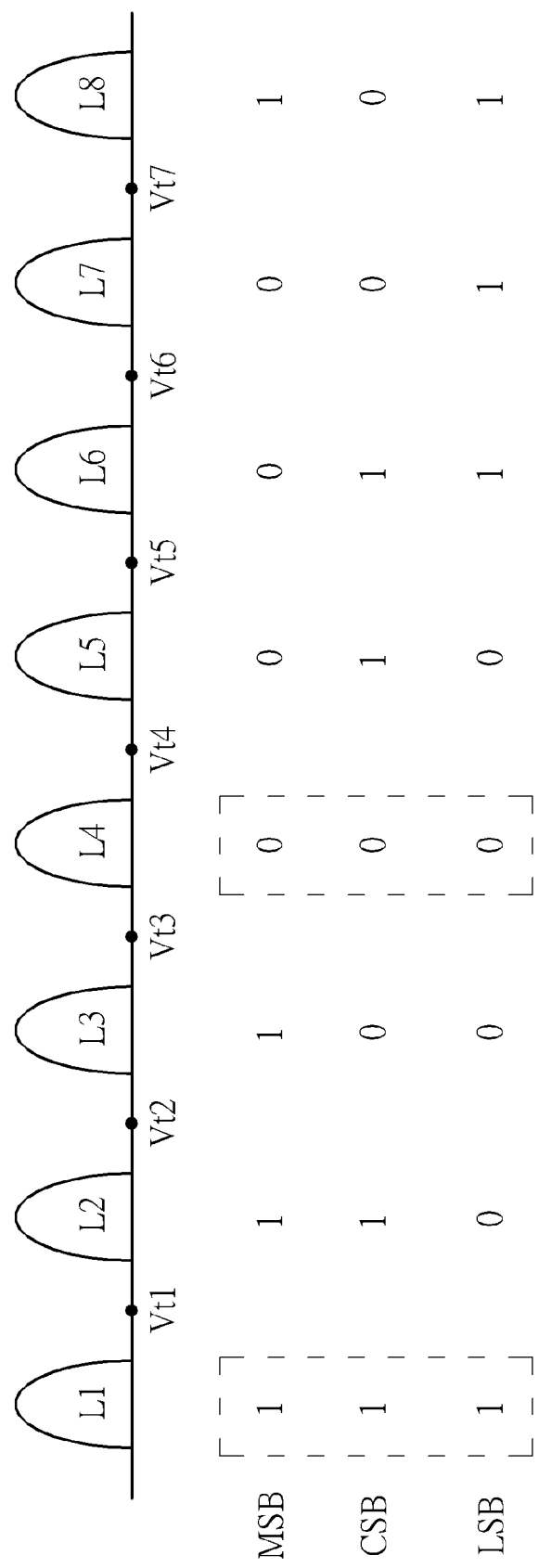
FIG. 6 is a diagram illustrating the floating-gate transistor only being programmed to two specific voltage levels L1 and L4.

As shown in FIG. 6, because every floating-gate transistor 202 of the word line WL0 of FIG. 2 is only be programmed to have the voltage L1 (i.e. (MSB, CSB, LSB)=(1, 1, 1)) or the voltage level L4. Therefore, after the flash memory 120 is packaged and assembled to be the memory device 110, even the voltage level L4 occurs shift and shifts right to voltage level L5, it will not occur reading error when the memory controller 110 uses the threshold voltages Vt1 and Vt5 to read the floating-gate transistor of the word line WL0.

Comparing to floating-gate transistor can be programmed to any voltage level L1 to L8 in the prior art, the present invention only uses two specific voltage levels L1 and L4 when writing the ISP code into floating-gate transistor, in this way, the ISP code written into the flash memory 120 has better noise margin, and the ISP code read by the memory controller 110 has better correctness.

Figure 5:
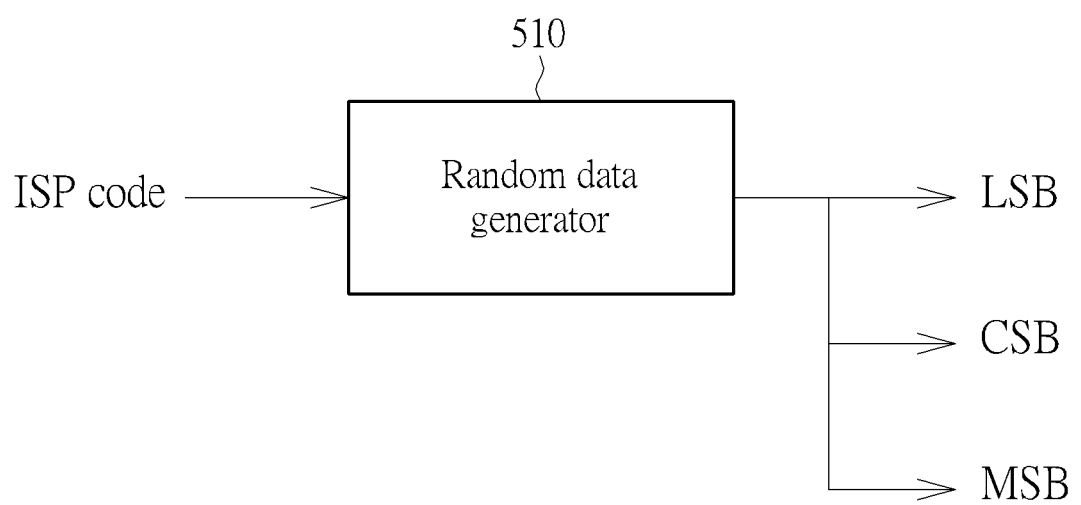
FIG. 5 is a diagram illustrating a random data generator generating a pseudo-random bit sequence according to the ISP code.

In addition, the statements in FIG. 5 and FIG. 6 are for illustrative purpose only, not a limitation of this present invention. In other embodiments of the present invention, the encoding scheme corresponding the LSB, the CSB and the MSB to voltage levels L1 to L8 can be replaced by any adequate encoding scheme, and the two specific voltage levels that floating-gate transistor will be programmed to are not necessarily L1 and L4, as long as the floating-gate transistor is only programmed to two specific voltage levels in the process of writing the ISP code in, and at least one of the two specific voltage levels is not the closest one to the threshold voltage. Without disobeying the spirit of the present invention, ISP code can be written into the flash memory 120 in other ways (for example the two specific voltage levels can be L1 and L3), and this alternative design shall fall within the scope of this present invention.

In addition, after the memory controller 110 reads the ISP code of the flash memory 120 and executes initialization, the data (e.g. the ISP data) stored in the page of the flash memory 120 can be erased and the floating-gate transistors on the page can be programmed to have any voltage level L1 to L8.

Briefly summarized, in the method for writing data into flash memory of this present invention, because the float-gate transistor of the flash memory can only be programmed to two specific voltage levels, and at least one of the two specific voltage levels is not the closet one to the threshold voltage. Therefore, the written data has better noise margin, and the data read by the memory controller 110 has better correctness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, which comprising:
a flash memory, wherein the flash memory is a Triple-Level Cell flash memory, each storage unit of the flash memory is implemented by a floating-gate transistor and each storage unit supports eight write voltage levels; and
a memory controller arranged to access the flash memory; wherein before the first time the memory controller reads the flash memory, data in the flash memory is stored with only two specific voltage levels of the eight write voltage levels, wherein the data comprises least significant bits (LSBs), central significant bits (CSBs) and most significant bits (MSBs).

2. The memory device of claim 1, wherein the data is an In-System Programming code.

3. The memory device of claim 1, wherein the eight write voltage levels sequentially are a first voltage level, a second voltage level, a third voltage level, a fourth voltage level, a fifth voltage level, a sixth voltage level, a seventh voltage level, and an eighth voltage level respectively, the MSB, the CSB and the LSB corresponded to the first voltage level are (1, 1, 1) respectively, the MSB, the CSB and the LSB corresponded to the second voltage level are (1, 1, 0) respectively, the MSB, the CSB and the LSB corresponded to the third voltage level are (1, 0, 0) respectively, the MSB, the CSB and the LSB corresponded to the fourth voltage level are (0, 0, 0) respectively, the MSB, the CSB and the LSB corresponded to the fifth voltage level are (0, 1, 0) respectively, the MSB, the CSB and the LSB corresponded to the sixth voltage level are (0, 1, 1) respectively, the MSB, the CSB and the LSB corresponded to the seventh voltage level are (0, 0, 1) respectively, the MSB, the CSB and the LSB corresponded to the eighth voltage level are (1, 0, 1) respectively, and the two specific voltage levels are the first voltage level and the fourth voltage level respectively.

4. A flash memory, wherein the flash memory is a Triple-Level Cell flash memory, each storage unit of the flash memory is implemented by a floating-gate transistor and each storage unit supports eight write voltage levels; wherein before the first time the flash memory is read by a memory controller, data in the flash memory is stored with only two specific voltage levels of the eight write voltage levels, wherein the data comprises least significant bits (LSBs), central significant bits (CSBs) and most significant bits (MSBs).

5. The memory device of claim 4, wherein the data is an In-System Programming code.

6. The memory device of claim 4, wherein the eight write voltage levels sequentially are a first voltage level, a second voltage level, a third voltage level, a fourth voltage level, a fifth voltage level, a sixth voltage level, a seventh voltage level, and an eighth voltage level respectively, the MSB, the CSB and the LSB corresponded to the first voltage level are (1, 1, 1) respectively, the MSB, the CSB and the LSB corresponded to the second voltage level are (1, 1, 0) respectively, the MSB, the CSB and the LSB corresponded to the third voltage level are (1, 0, 0) respectively, the MSB, the CSB and the LSB corresponded to the fourth voltage level are (0, 0, 0) respectively, the MSB, the CSB and the LSB corresponded to the fifth voltage level are (0, 1, 0) respectively, the MSB, the CSB and the LSB corresponded to the sixth voltage level are (0, 1, 1) respectively, the MSB, the CSB and the LSB corresponded to the seventh voltage level are (0, 0, 1) respectively, the MSB, the CSB and the LSB corresponded to the eighth voltage level are (1, 0, 1) respectively, and the two specific voltage levels are the first voltage level and the fourth voltage level respectively.

* * * * *